(12) United States Patent
Crowley et al.

(10) Patent No.: US 7,045,396 B2
(45) Date of Patent: May 16, 2006

(54) STACKABLE SEMICONDUCTOR PACKAGE AND METHOD FOR MANUFACTURING SAME

(75) Inventors: Sean Timothy Crowley, Phoenix, AZ (US); Angel Orabuena Alvarez, Gilbert, AZ (US); Jun Young Yang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 208 days.

(21) Appl. No.: 10/439,671

(22) Filed: May 16, 2003

(65) Prior Publication Data

US 2003/0197290 A1 Oct. 23, 2003

Related U.S. Application Data

(62) Division of application No. 09/687,531, filed on Oct. 13, 2000, now Pat. No. 6,605,866.

(30) Foreign Application Priority Data

Dec. 16, 1999 (KR) ............................................ 99-58166

(51) Int. Cl.
*H01L 21/44* (2006.01)

(52) U.S. Cl. ........................ 438/123; 257/692; 257/777
(58) Field of Classification Search ................ 257/692, 257/777; 438/123
See application file for complete search history.

(56) References Cited

U.S. PATENT DOCUMENTS

| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,259,381 A | 3/1981 | Inaba |

(Continued)

FOREIGN PATENT DOCUMENTS

| DE | 1973494 A1 | 8/1997 |
| EP | 54021117 | 6/1979 |
| EP | 59050939 | 3/1984 |
| EP | 0393997 | 10/1990 |
| EP | 0459493 | 12/1991 |
| EP | 0720225 | 3/1996 |
| EP | 0720234 | 3/1996 |

(Continued)

*Primary Examiner*—Christian D. Wilson
(74) *Attorney, Agent, or Firm*—Stetina Brunda Garred & Brucker

(57) ABSTRACT

Leadframe-type semiconductor packages that allow the semiconductor packages to be stacked on top of each other. One aspect of the semiconductor package includes a leadframe, a plurality of electrical connectors, a semiconductor chip, and a sealing material for encapsulating the above components. The leadframe has a plurality of leads, with each one of the plurality of leads running from the top of the semiconductor package to the bottom of the semiconductor package. Each one of the plurality of leads has a top portion protruding from the top surface of the semiconductor package and a bottom portion protruding from the top surface of the semiconductor package and a bottom portion protruding from the bottom surface of the semiconductor package. The leads allow for electrical connection of a second semiconductor package placed on top of the first semiconductor package. Further, the protruding parts of the leads form a space between the stacked semiconductor packages for improved heat dissipation.

19 Claims, 14 Drawing Sheets

U.S. PATENT DOCUMENTS

| | | |
|---|---|---|
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,029,386 A | 7/1991 | Chao et al. |
| 5,041,902 A | 8/1991 | McShane |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasaranthi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |

| | | | | | | |
|---|---|---|---|---|---|---|
| 6,001,671 | A | 12/1999 | Fjelstad | 6,373,127 | B1 | 4/2002 | Baudouin et al. |
| 6,018,189 | A | 1/2000 | Mizuno | 6,380,048 | B1 | 4/2002 | Boon et al. |
| 6,025,640 | A | 2/2000 | Yagi et al. | 6,384,472 | B1 | 5/2002 | Huang |
| 6,031,279 | A | 2/2000 | Lenz | 6,388,336 | B1 | 5/2002 | Venkateshwaran et al. |
| RE36,613 | E | 3/2000 | Ball | 6,395,578 | B1 | 5/2002 | Shin et al. |
| 6,034,423 | A | 3/2000 | Mostafazadeh | 6,400,004 | B1 | 6/2002 | Fan et al. |
| 6,040,626 | A | 3/2000 | Cheah et al. | 6,414,385 | B1 | 7/2002 | Huang et al. |
| 6,043,430 | A | 3/2000 | Chun | 6,437,429 | B1 | 8/2002 | Su et al. |
| 6,060,768 | A | 5/2000 | Hayashida et al. | 6,444,499 | B1 | 9/2002 | Swiss et al. |
| 6,060,769 | A | 5/2000 | Wark | 6,448,633 | B1 | 9/2002 | Yee et al. |
| 6,072,228 | A | 6/2000 | Hinkle et al. | 6,452,279 | B1 | 9/2002 | Shimoda |
| 6,075,284 | A | 6/2000 | Choi et al. | 6,464,121 | B1 | 10/2002 | Reijnders |
| 6,081,029 | A | 6/2000 | Yamaguchi | 6,476,474 | B1 | 11/2002 | Hung |
| 6,084,310 | A | 7/2000 | Mizuno et al. | 6,482,680 | B1 | 11/2002 | Khor et al. |
| 6,087,722 | A | 7/2000 | Lee et al. | 6,498,099 | B1 | 12/2002 | McLellan et al. |
| 6,100,594 | A | 8/2000 | Fukui et al. | 6,498,392 | B1 | 12/2002 | Azuma |
| 6,113,474 | A | 9/2000 | Constantini et al. | 6,507,120 | B1 | 1/2003 | Lo et al. |
| 6,118,174 | A | 9/2000 | Kim | 6,559,525 | B1 | 5/2003 | Huang |
| 6,118,184 | A | 9/2000 | Ishio et al. | 6,605,866 | B1 * | 8/2003 | Crowley et al. ............ 257/692 |
| RE36,907 | E | 10/2000 | Templeton, Jr. et al. | 2001/0008305 | A1 | 7/2001 | McLellan et al. |
| 6,130,115 | A | 10/2000 | Okumura et al. | 2001/0011645 | A1 | 8/2001 | Kwan et al. |
| 6,130,473 | A | 10/2000 | Mostafazadeh et al. | 2002/0011655 | A1 | 1/2002 | Kimura |
| 6,133,623 | A | 10/2000 | Otsuki et al. | 2002/0024122 | A1 | 2/2002 | Jung et al. |
| 6,140,154 | A | 10/2000 | Hinkle et al. | 2002/0027297 | A1 | 3/2002 | Ikenaga et al. |
| 6,143,981 | A | 11/2000 | Glenn | 2002/0140061 | A1 | 10/2002 | Lee et al. |
| 6,169,329 | B1 | 1/2001 | Farnworth et al. | 2002/0140068 | A1 | 10/2002 | Lee |
| 6,177,718 | B1 | 1/2001 | Kozono | 2002/0163015 | A1 | 11/2002 | Lee et al. |
| 6,181,002 | B1 | 1/2001 | Juso et al. | 2003/0073265 | A1 | 4/2003 | Hu et al. |
| 6,184,465 | B1 | 2/2001 | Corisis | | | | |
| 6,194,777 | B1 | 2/2001 | Abbott et al. | | | | |

FOREIGN PATENT DOCUMENTS

| | | |
|---|---|---|
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | McLellan et al. |
| 6,229,205 B1 | 5/2001 | Jeong et al. |
| 6,239,384 B1 | 5/2001 | Smith et al. |
| 6,242,281 B1 | 6/2001 | McLellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,454 B1 | 4/2002 | Chung |

| | | |
|---|---|---|
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 61395855 | 2/1986 |
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64074749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 864634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992776 | 4/1997 |
| JP | 9293822 | 11/1997 |
| JP | 10022447 | 1/1998 |
| JP | 10199934 | 7/1998 |

| | | | | | |
|---|---|---|---|---|---|
| JP | 10256240 | 9/1998 | KR | 0049944 | 6/2002 |
| JP | 00150765 | 5/2000 | WO | 9956316 | 11/1999 |
| KR | 941979 | 1/1994 | WO | 9967821 | 12/1999 |
| KR | 199772358 | 11/1997 | | | |
| KR | 100220154 | 6/1999 | | | |

* cited by examiner

STACKABLE SEMICONDUCTOR PACKAGE AND METHOD FOR MANUFACTURING SAME

CROSS REFERENCE TO RELATED APPLICATION

The present application is a divisional of U.S. application Ser. No. 09/687,531 entitled STACKABLE SEMICONDUCTOR PACKAGE AND METHOD FOR MANUFACTURING SAME filed Oct. 13, 2002, now U.S. Pat. No. 6,605,866.

STATEMENT RE: FEDERALLY SPONSORED RESEARCH/DEVELOPMENT (Not Applicable)

BACKGROUND OF THE INVENTION

1. Field of the Invention

The present invention relates to semiconductor packages, leadframe assemblies therefor, and a method of manufacture, and, more particularly, but not by way of limitation, to leadframe-type semiconductor packages that allow the semiconductor packages to be stacked one atop the other.

2. History of Related Art

It is conventional in the electronics industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic appliances are typically manufactured in reduced sizes and at reduced costs, which results in increased consumer demand. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to printed circuit boards and support the semiconductor chips on the printed circuit boards, have been designed to have a small size. By way of example only, such semiconductor packages may have a size on the order of 1×10 mm to 10×10 mm.

Even though semiconductor packages have been miniaturized, space on a printed circuit board remains limited and precious. Thus, there is a need to find both a method and a semiconductor package design to maximize the number of semiconductor packages that can be fitted onto an electronic device, yet minimize the space needed to attach these semiconductor packages. One method to minimize space needed to attach the semiconductor packages is to stack the semiconductor packages on top of each other.

Further, once the semiconductor packages are stacked onto each other, there is a need to be able to adequately dissipate the heat generated by the operation of each semiconductor chip in each one of the semiconductor chip packages.

BRIEF SUMMARY OF THE INVENTION

The various embodiments of the present invention relate to leadframe-type semiconductor packages that allow the semiconductor packages to be stacked on top of each other. More particularly, one aspect of the present invention comprises a semiconductor package that includes a leadframe, a plurality of electrical connectors, a semiconductor chip, and a sealing material for encapsulating the above components. The leadframe has a plurality of leads, with each one of the plurality of leads running from the top of the semiconductor package to the bottom of the semiconductor package. Each one of the plurality of leads has a top portion protruding from the top surface of the semiconductor package and a bottom portion protruding from the bottom surface of the semiconductor package. The leads allow for electrical connection of a second semiconductor package placed on top of the first semiconductor package. Further, the protruding parts of the leads form a space between the stacked semiconductor packages for improved heat dissipation.

BRIEF DESCRIPTION OF THE DRAWINGS

A more complete understanding of the method and apparatus of the present invention may be had by reference to the following detailed description with like reference numerals denoting like elements when taken in conjunction with the accompanying drawings wherein.

DETAILED DESCRIPTION OF THE INVENTION

Prior to discussing the various embodiments of the present invention, a prior art leadframe-type semiconductor package will be discussed below in order to better understand MLF-type semiconductor packages in general.

Figure 1:
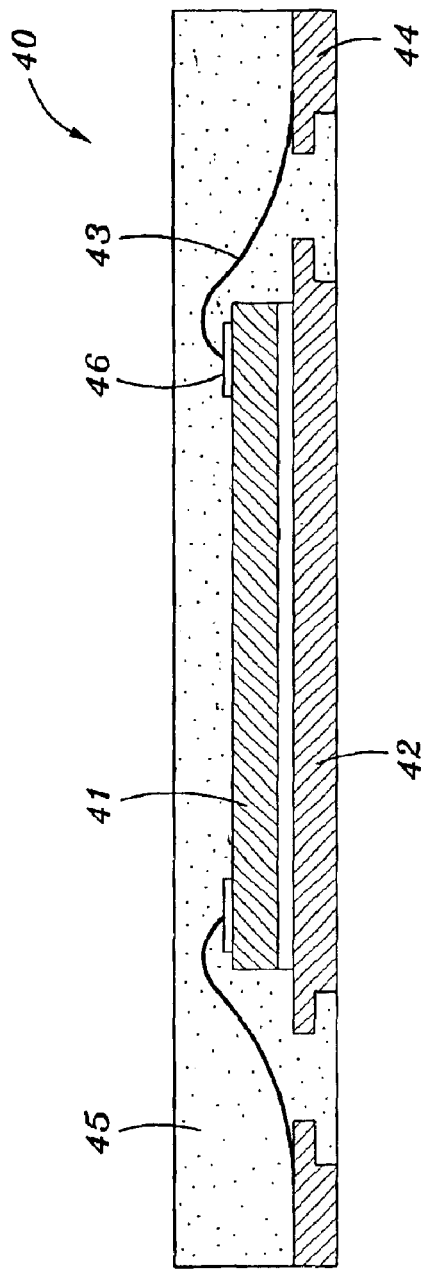
FIG. 1 is a cross-section of a prior art leadframe-type semiconductor package.

Referring first to FIG. 1, there is shown a cross-section of a prior art leadframe-type semiconductor package 40. Semiconductor package 40 has a leadframe 47 comprising a paddle 42 and a plurality of leads 44, a semiconductor chip 41, and a plurality of wires 43. The entire assembly is enclosed in a nonconductive sealing material 45 such as thermoplastics or thermoset resins, with thermoset resins including silicones, phenolics, and epoxies.

Still referring to FIG. 1, semiconductor chip 41 is attached to paddle 42. A plurality of connecting pads 46 are located on semiconductor chip 41. A plurality of leads 44 surround, but do not touch, semiconductor chip 41 and paddle 42. Wires 43 connect the connecting pads 46 to leads 44. Leads 44 are generally rectangular in cross-section. Leads 44 are located along the periphery of semiconductor package 40 for connection with a printed circuit board (not shown). Sealing material 45 encapsulates leads 44, wires 43, and semiconductor chip 41 except for the bottommost surfaces of paddle 42 and leads 44. Since sealing material 45 is nonconductive, if a second prior art semiconductor package (not shown) is stacked on top of semiconductor package 40, the second prior art semiconductor package cannot operate because it has no electrical path to connect to. Thus, it is difficult if not impossible for prior art leadframe-type semiconductor packages to be stacked on top of each other and still operate as intended.

Still referring to FIG. 1, in leadframe-type semiconductor packages, heat generated from the operation of semiconductor chip 41 is dissipated via a lower exposed surface of paddle 42 and the lower and lateral exposed surfaces of leads 44. Thus, when prior art leadframe-type semiconductor packages are stacked on each other—even if the electrical connection problem is solved—the top of the bottom semiconductor package touches the bottom of the top semiconductor package and obstructs the heat flow from the second semiconductor package to the outside, thereby preventing proper heat dissipation by the second semiconductor package.

Figure 2:
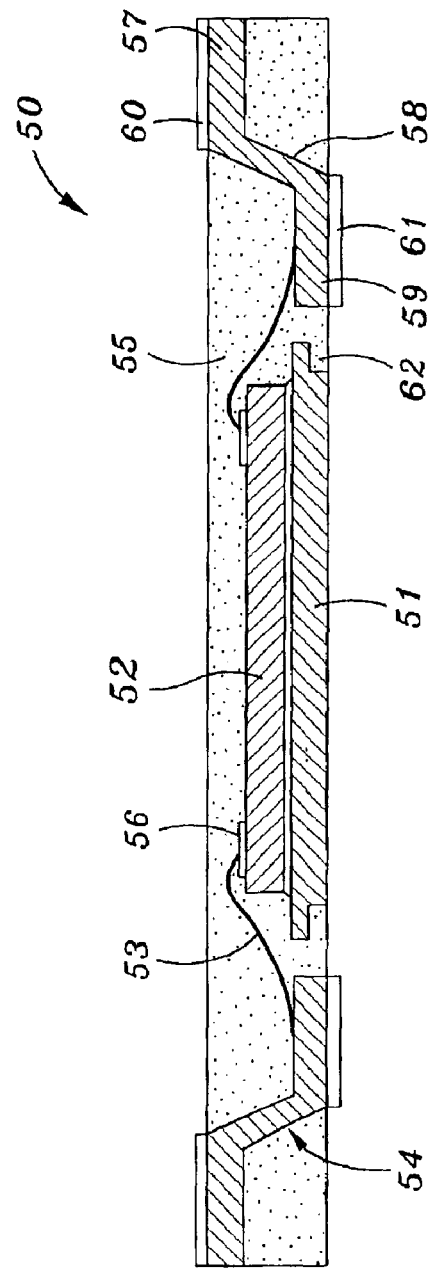
FIG. 2 is a cross-section of an embodiment of a semiconductor package constructed in accordance with the principles of the present invention.

Referring to FIG. 2, there is shown a cross-section of semiconductor package 50, which is an embodiment of a semiconductor package constructed in accordance with the principles of the present invention. Semiconductor package 50 has a semiconductor chip 52, and a plurality of thin wires 53. The components listed above are enclosed in a nonconductive sealing material 55 made of thermoplastics or thermoset resins, with the thermoset resins including silicones, phenolics, and epoxies.

Still referring to FIG. 2, the semiconductor package 50 has a leadframe 62 comprising a paddle 51 and leads 54. Paddle 51 and leads 54 are secured to leadframe 62 by a tie bar (not shown). Paddle 51 has a top surface, a bottom surface, and may, but does not necessarily have to, have a lateral etched side. The lateral etched side, if present, increases the locking strength between paddle 51 and sealing material 55. The top surface of paddle 51 is attached to semiconductor chip 52 while the bottom surface of paddle 51 is exposed to the outside of semiconductor package 50. The exposed bottom surface of paddle 51 is electroplated with a corrosion-minimizing material such as, for example, tin, gold, tin lead, tin bismuth, nickel palladium, or an alloy thereof. The bottom surface of paddle 51 may be attached to a printed circuit board (not shown) or another semiconductor package constructed in accordance with the principles of the present invention. Paddle 51 is made of an electrically and heat conducting material such as, for example, copper. Heat generated from the operation of semiconductor chip 52 can be dissipated to the outside of semiconductor package 50 through the bottom surface of paddle 51.

Still referring to FIG. 2, a plurality of leads 54 surround but do not touch paddle 51. Leads 54 are roughly "S" shaped and are made of electrically conductive material such as, for example, copper. Because all leads 54 are generally similar in construction, only one of the leads 54 will be described in detail below. It should be understood that the description applies to all leads 54.

Still referring to FIG. 2, lead 54 can be further subdivided into three portions: upper portion 57, middle portion 58, and lower portion 59. A small section 60 of the top side of upper portion 57 protrudes out of the top surface of semiconductor package 50. Similarly, a small section 61 of the bottom side of lower portion 59 protrudes out of the bottom surface of semiconductor package 50. Sections 60 and 61 are made of an electrically conductive material such as, for example, a solder plate attached to upper portion 57 and lower portion 59. Sections 60 and 61 are used to physically and electrically connect semiconductor package 50 to an integrated circuit board (not shown) or another semiconductor package (not shown). Further, sections 60 and 61 are also used to form a space (not shown) between semiconductor package 50 and another semiconductor package. The space (not shown) facilitates heat dissipation. Possible configurations for stacking the semiconductor packages will be described later below.

Semiconductor package 50 has a semiconductor chip 52 attached to paddle 51 via an adhesive. A plurality of leads 54 electrically connect to semiconductor chip 52 through the plurality of wires 53. Each one of the wires 53 has a first end electrically connected to a bond pad 56 located on a top surface of semiconductor chip 52 and a second end connected to lower portion 59 of one of the leads 54. Wires 53 can be made of any electrically conductive material such as, for example, gold, aluminum, or silver.

Semiconductor chip 52, paddle 51, wires 53, and leads 54 are all encapsulated by sealing material 55. Sealing material 55 is nonconductive and can be thermoplastics or thermoset resins, with thermoset resins including silicones, phenolics, and epoxies. Sealing material 55 preserves the spatial relationship between paddle 51, wires 53, and leads 54 of semiconductor package 50. Sealing material 55 also protects the components of semiconductor package 50 from damage. More specifically, except for the small sections 60 and 61, leads 54 are completely enclosed by sealing material 55, thus preventing another object from touching and accidentally shorting leads 54. The exposed parts of the leadframe—small sections 60, 61, and the bottom surface of paddle 51—are coated or electroplated with a protective material such as, for example, tin, gold, tin lead, tin bismuth, nickel palladium, or an alloy thereof.

Figure 3:
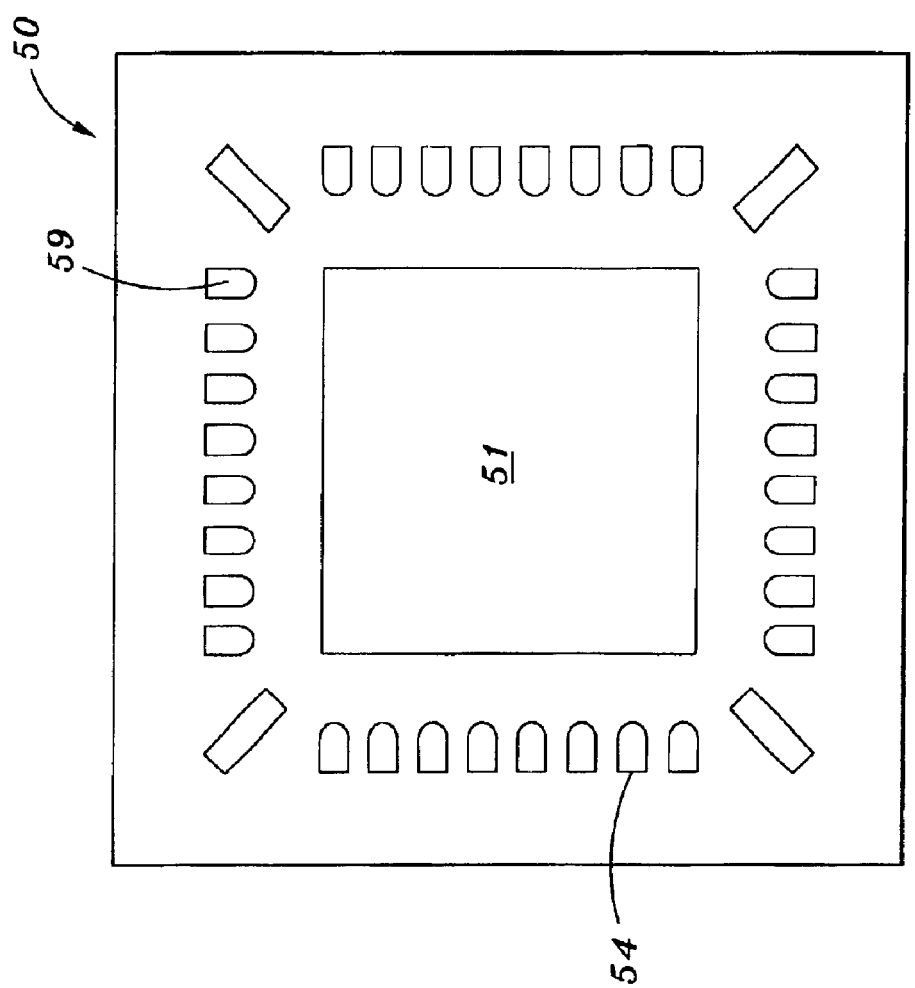
FIG. 3 is a bottom plan view of an embodiment of a semiconductor package constructed in accordance with the principles of the present invention.

Referring now to FIG. 3, there is shown a bottom plan view of semiconductor package 50. As shown in FIG. 3, paddle 51 is located generally in the middle of semiconductor package 50 and surrounded by the plurality of leads 54. Only the lower portion 59 of the leads 54 is visible from this bottom plan-view of semiconductor package 50.

Figure 4:
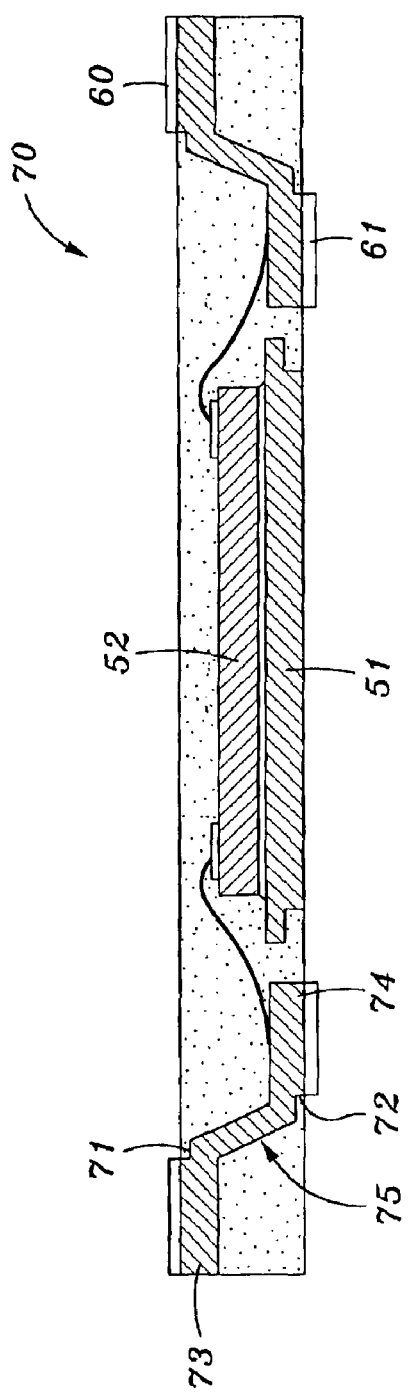
FIG. 4 is a cross-section of another embodiment of a semiconductor package constructed in accordance with the principles of the present invention.

Referring now to FIG. 4, there is shown a cross-section of semiconductor package 70, which is another embodiment of the semiconductor package constructed in accordance with the principles of the present invention. Semiconductor package 70 is generally similar to semiconductor package 50 in construction except semiconductor package 70 has etching portions 71 and 72 on leads 75. Etching portions 71 and 72 are formed near an upper portion 73 and lower portion 74 of each one of the leads 75 of semiconductor package 70. Etching portions 71 and 72 increase the locking strength between leads 75 and sealing material 55 to minimize the possibility of leads 75 from becoming detached from semiconductor package 70. Etching portions 71 and 72 also help to suppress movement of leads 75 within semiconductor package 70.

Figure 5:
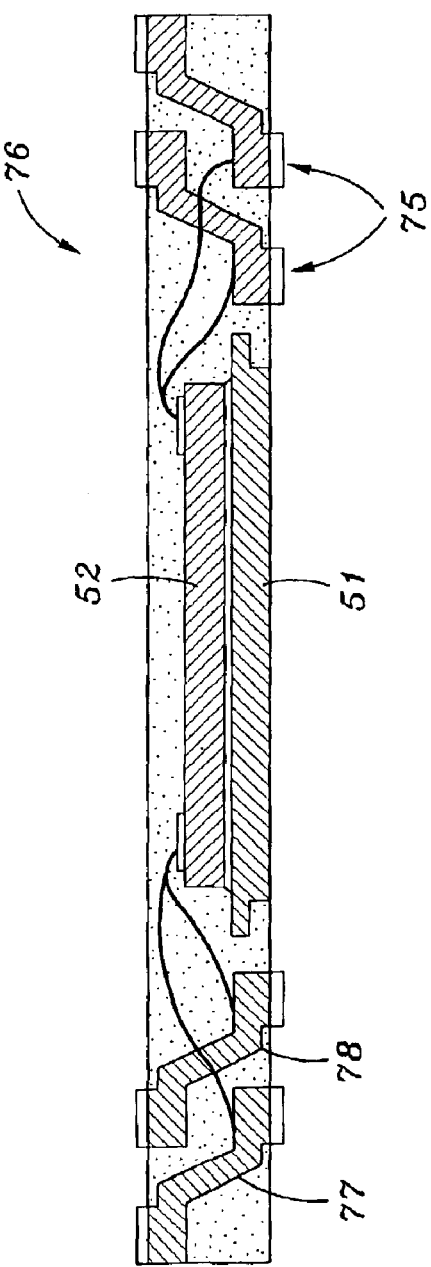
FIG. 5 is a cross-section of another embodiment of a semiconductor package constructed in accordance with the principles of the present invention.

Referring now to FIG. 5, there is shown a cross-section of semiconductor package 76, which is another embodiment of the semiconductor package constructed in accordance with the principles of the present invention. In addition to having all of the components of semiconductor package 50, semiconductor package 76 has two rows 77 and 78 of leads 75 surrounding semiconductor chip 52 and paddle 51.

Figure 6:
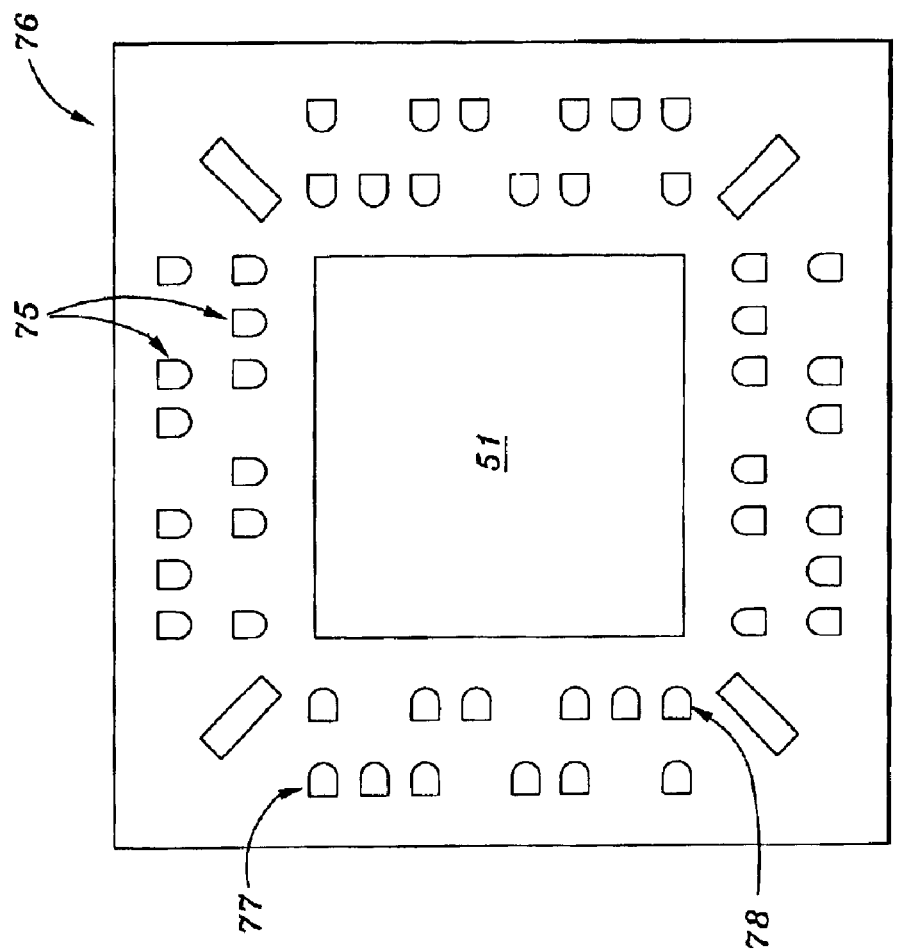
FIG. 6 is a bottom plan view of another embodiment of a semiconductor package constructed in accordance with the principles of the present invention.

Referring now to FIG. 6, there is shown a bottom plan view of semiconductor package 76. As shown by FIG. 6, rows 77 and 78 have randomly placed leads 75 surrounding paddle 51.

Figure 7:
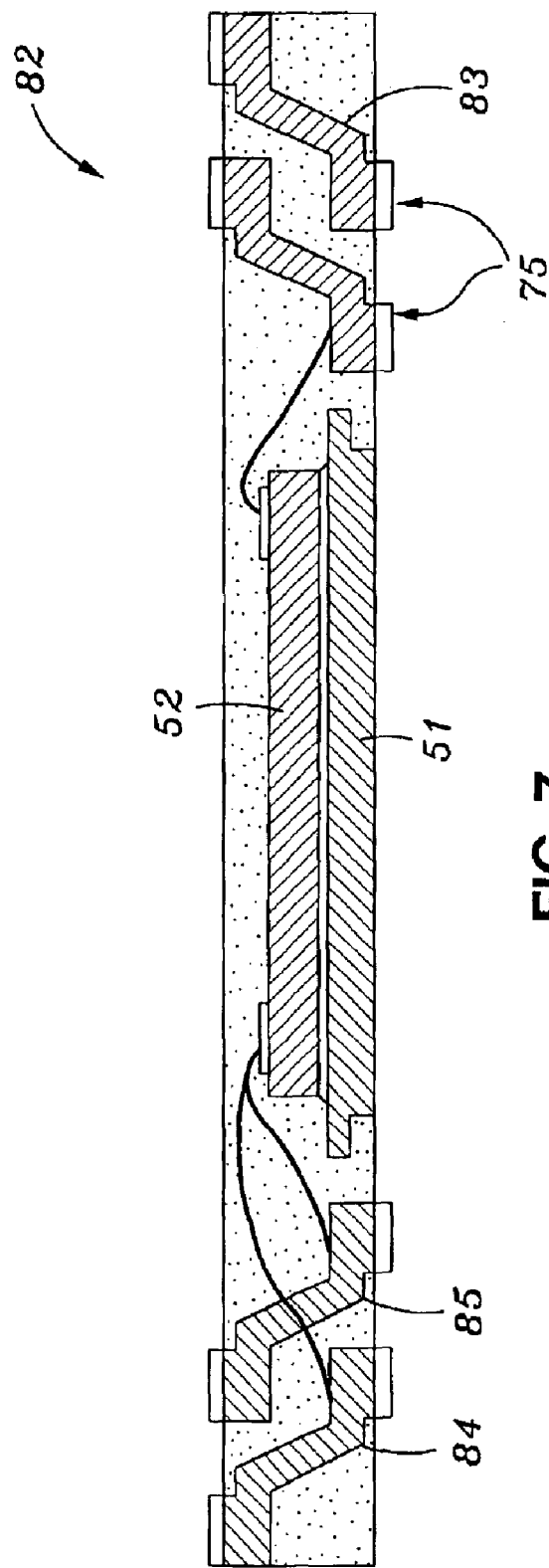
FIG. 7 is a cross-section of another embodiment of a semiconductor package constructed in accordance with the principles of the present invention.
Figure 8:
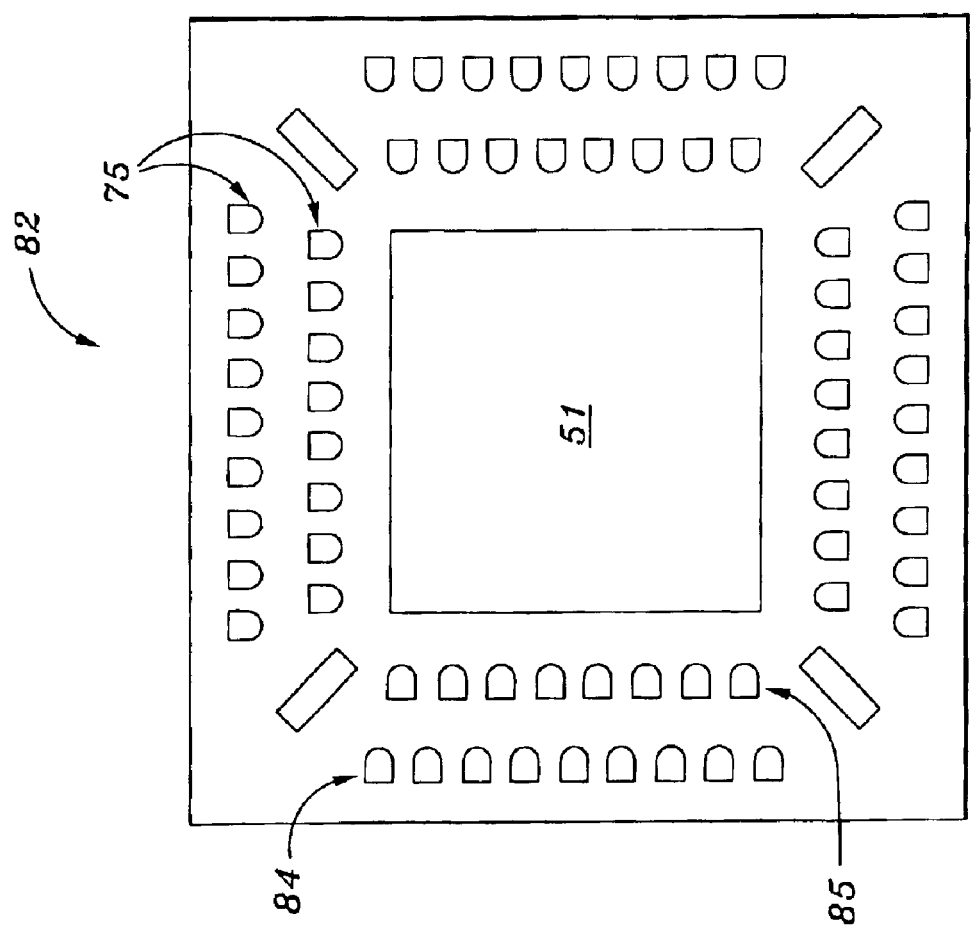
FIG. 8 is a bottom plan view of another embodiment of a semiconductor package constructed in accordance with the principles of the present invention.

Referring now to FIGS. 7 and 8 together, there is shown a cross-section and a bottom plan view of semiconductor package 82, which is another embodiment of a semiconductor package constructed in accordance with the principles of the present invention. Semiconductor package 82 differs from the other embodiments of the present invention in that the leads 75 in rows 84 and 85, as shown in FIG. 8, are lined up at regular intervals.

Figure 9:
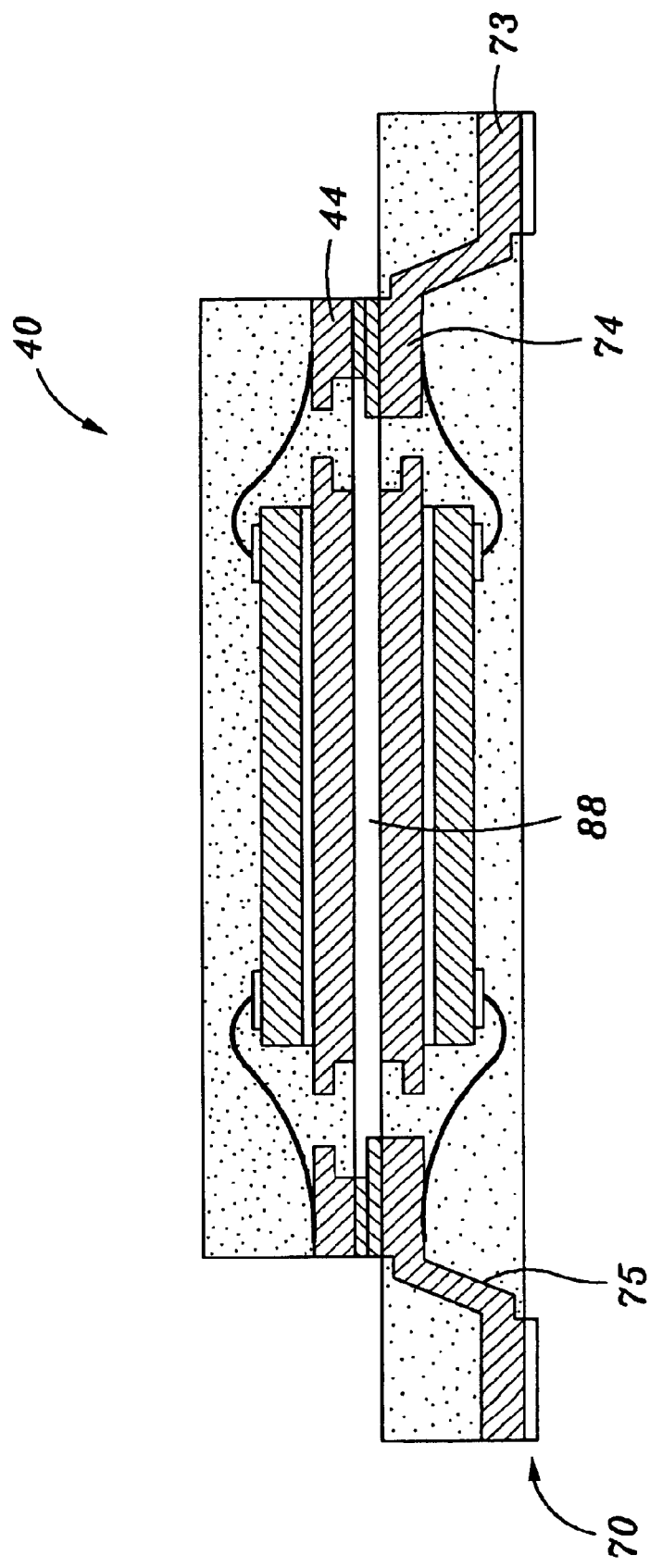
FIG. 9 is a cross-section of a semiconductor package stacked with an embodiment of a semiconductor package constructed in accordance with the principles of the present invention.

Referring now to FIG. 9, there is shown a cross-section of a semiconductor package 40 stacked onto the semiconductor package 70 of FIG. 4. Semiconductor package 70 is inverted so that the upper portion 73 of leads 75 can be attached to a printed circuit board (not shown) or attached to another semiconductor package of the present invention (not shown) having leads in generally the same place as semiconductor package 70. The bottom surface of semiconductor package 70 is now turned up so that lower portion 74 of leads 75 faces upwards. Semiconductor package 40 is then placed on top of semiconductor package 70 so that leads 44 of semiconductor package 40 physically connect and electrically contact with the lower portion 74 of leads 75 of semiconductor package 70. Because the lower portion 74 of the leads 75 protrudes slightly out of semiconductor package 70, the protrusion creates a space 88. This space 88 allows increased heat dissipation by both semiconductor package 40 and semiconductor package 70. The semiconductor packages 40 and 50 are held in this stacked position by applying solder—or any material commonly used in the art—between the semiconductor packages and/or between a semiconductor package and a printed circuit board.

Figure 10:
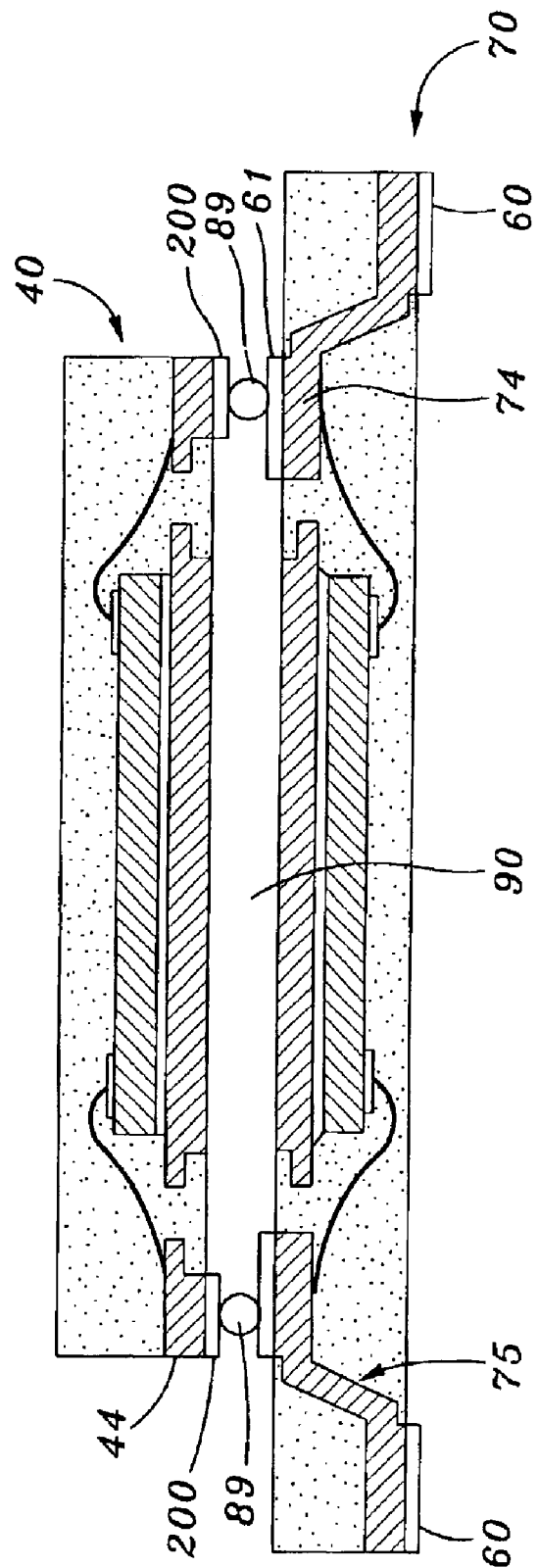
FIG. 10 is a cross-section of another semiconductor package stacked with an embodiment of a semiconductor package constructed in accordance with the principles of the present invention.

Referring now to FIG. 10, there is shown a cross-section of a prior art semiconductor package 40 stacked onto semiconductor package 70. The orientation and physical locations of the semiconductor packages 40, 70 remain the same as the method already discussed above. However, a plurality of solder plate layers 200 are attached to the leads 44 of semiconductor package 40 so that solder plate layers 200 protrude out of the bottom surface of semiconductor packages 40. A plurality of solder balls 89 are sandwiched between solder plate layers 200 and small section 61 of the lower portion 74 of leads 75 of semiconductor package 70. The solder balls 89 create a space 90 between semiconductor package 40 and semiconductor package 70 for heat dissipation.

Figure 11:
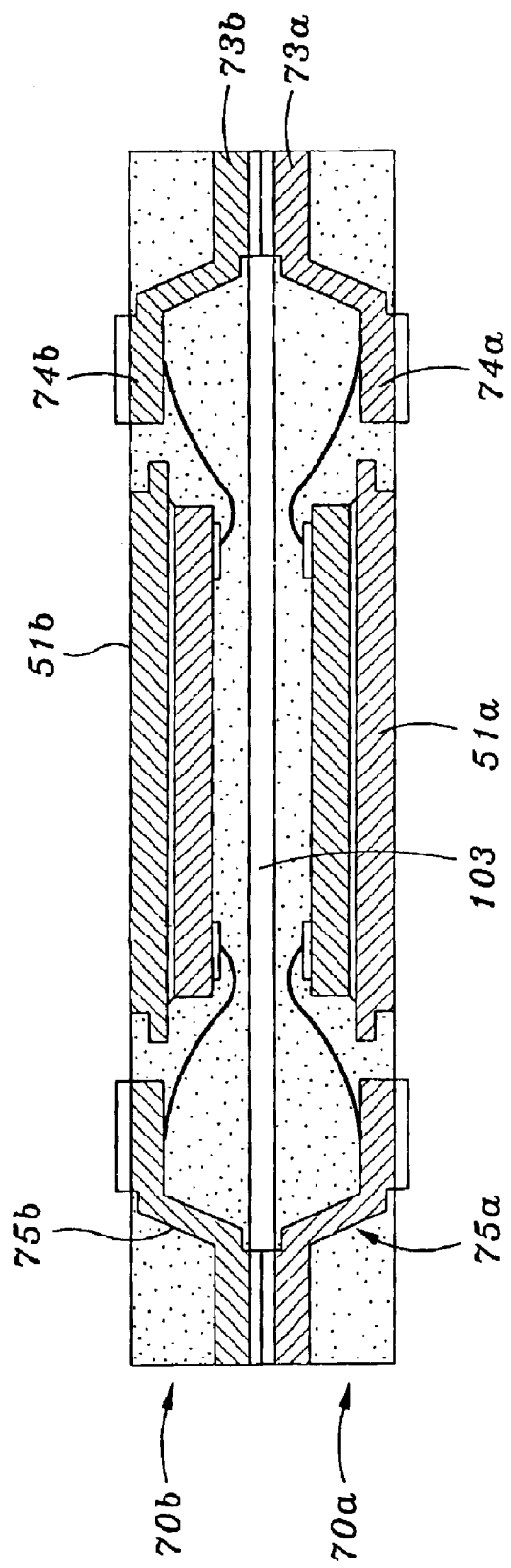
FIG. 11 is a cross-section of semiconductor packages stacked in an alternate configuration according to one embodiment of the present invention.

Referring now to FIG. 11, there is shown a cross-section of stacked semiconductor packages constructed in accordance with the principles of the present invention. A first semiconductor package 70a is attached right side up either to a printed circuit board (not shown) or to another semiconductor package (not shown) constructed in accordance with the principles of the present invention.

Still referring to FIG. 11, semiconductor package 70b also has a plurality of leads 75b. Each one of the leads 75b also has an upper portion 73b, and a lower portion 74b. Semiconductor package 70b is inverted and physically and electrically attached to semiconductor package 70a. Because semiconductor package 70b is inverted, upper portion 73b of leads 75b comes into physical and electrical contact with upper portion 73a of leads 75a of semiconductor package 70a. Electrical current can flow between semiconductor packages 70a and 70b. Semiconductor packages 70a and 70b are held in this stacked position by applying solder—or any material commonly used in the art—between the semiconductor packages and/or between a semiconductor package and a printed circuit board.

Still referring to FIG. 11, additional semiconductor packages can be stacked onto semiconductor package 70b by physically and electrically connecting lower portion 74b of lead 75a to a lower portion of another semiconductor package having leads in generally the same places as semiconductor package 70b. As shown in FIG. 11, heat produced by the electrical activities within semiconductor packages 70a and 70b can dissipate because paddles 51a and 51b do not touch. It should be noted that a plurality of solder balls (not shown) may also be sandwiched between upper portion 73a of lead 75a of semiconductor package 70a and upper portion 73b of lead 75b of semiconductor package 70a.

Figure 12:
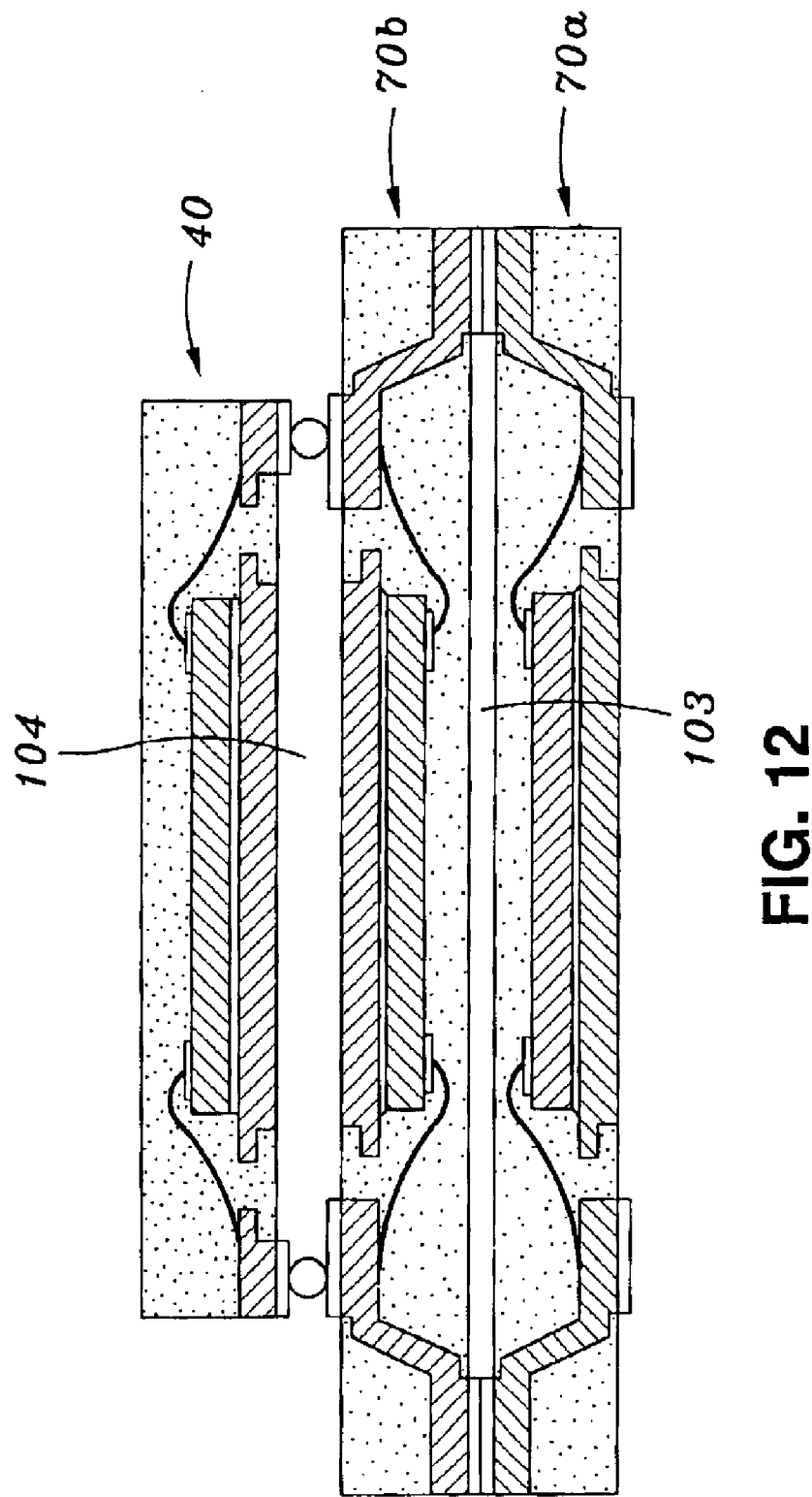
FIG. 12 is a cross-section of semiconductor packages stacked in an alternate configuration according to one embodiment of the present invention.

Referring now to FIG. 12, there is shown a cross-section of the stacked semiconductor packages constructed in accordance with the principles of the present invention. FIG. 12 shows semiconductor packages 70a, 70b and 40. The bottom surface of semiconductor package 70a can be physically and electrically connected to another semiconductor package (not shown) or to a printed circuit board (not shown). Semiconductor package 70b is stacked onto and electrically connected to semiconductor package 70a using the method and configuration disclosed in FIG. 11 above. Semiconductor package 40 is stacked on top of and electrically connected to semiconductor package 70b using the method disclosed in FIG. 10 above. Note spaces 103 and 104 between semiconductor packages 70a, 70b, and 40 allow heat dissipation between the semiconductor packages.

Figure 13:
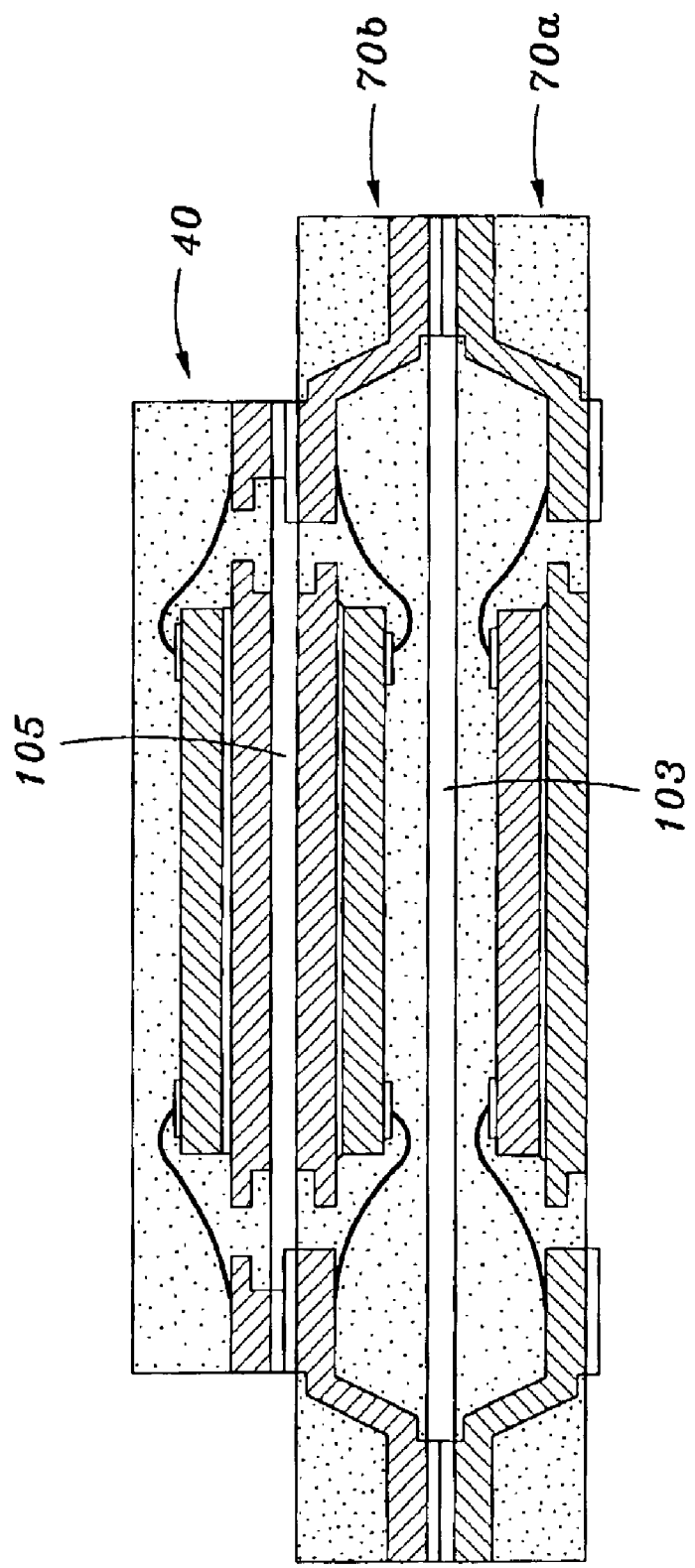
FIG. 13 is a cross-section of semiconductor packages stacked in another alternate configuration according to one embodiment of the present invention.

Referring now to FIG. 13, there is shown a cross-section of stacked semiconductor packages constructed in accordance with the principles of the present invention. FIG. 13 shows semiconductor packages 70a, 70b, and 40. Semiconductor packages 70a, 70b are stacked on each other using the method shown and described in FIG. 11 above. Semiconductor packages 70b, 40 are stacked on each other using the method shown and described in FIG. 9 above. Semiconductor package 70a may be attached either to a printed circuit board (not shown) or to another semiconductor package (not shown) having leads located generally in the same place as semiconductor package 70a. Spaces 103,105 between semiconductor packages 70a, 70b, and 40 allow for heat dissipation.

Figure 14:
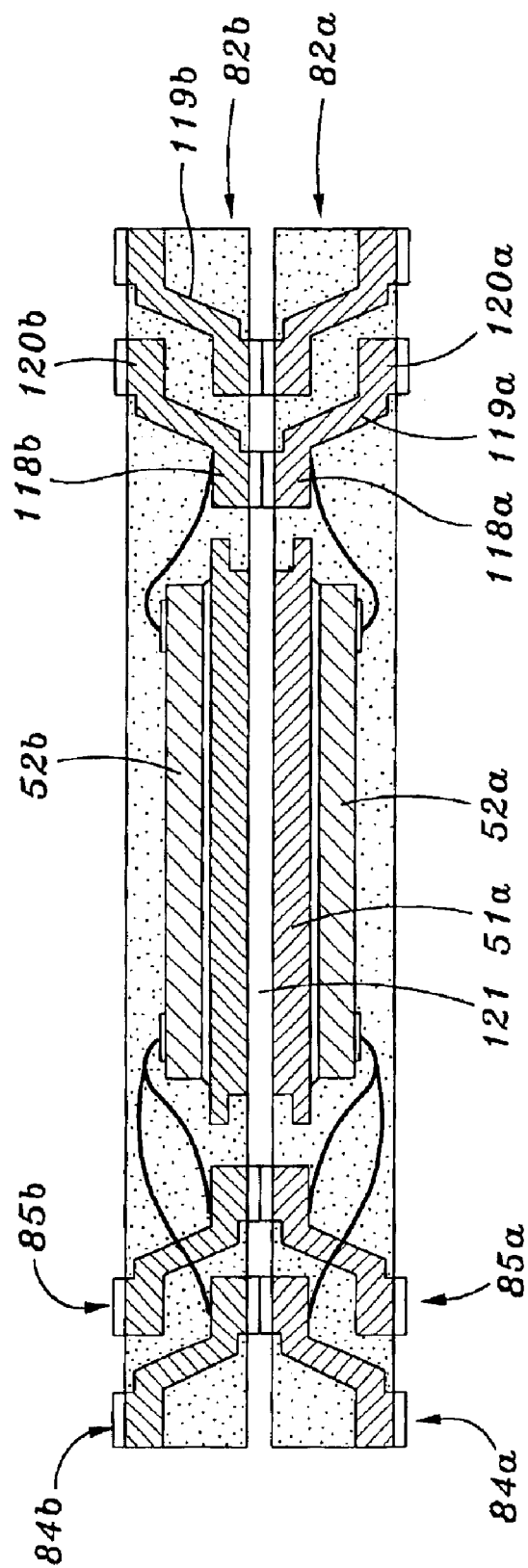
FIG. 14 is a cross-section of semiconductor packages stacked in another alternate configuration according to one embodiment of the present invention.

Referring now to FIG. 14, there is shown a stacked semiconductor packages 82a, 82b both having a cross section similar to the embodiment illustrated in FIG. 7. Semiconductor package 82a has a first series of leads 84a and a second series of leads 85a. Both first and second series of leads 84a, 85a surround the paddle 51a and semiconductor chip 52a of semiconductor package 82a. Each lead in the first and second series of leads 84a, 85a has an upper portion 118a, a middle portion 119a, and a lower portion 120a.

Still referring to FIG. 14, semiconductor package 82b also has a first series of leads 84b and a second series of leads 85b. Each lead in the first and second series of leads 84b, 85b also has an upper portion 118b, a middle portion 119b, and a lower portion 120b. The first and second series of leads 84b and 85b are arranged at generally the same location as the first and second series of leads 84a, 85a of semiconductor package 82a.

Still referring to FIG. 14, semiconductor packages 82a, 82b are stacked on each other by inverting semiconductor package 82b so that the upper portion 118b of each lead in the first and second series of leads 84b, 85b comes into physical contact and is electrically connected with the lower portion 120a of each lead in the first and second series of leads 84a, 85a of semiconductor package 82a. Upper portion 120b of each lead in the first and second series of leads 84b, 85b in semiconductor package 82b can either be physically attached to and electrically connected with a printed circuit board (not shown) or another semiconductor package (not shown) having leads located generally at the same place as semiconductor package 82a. A semiconductor package of the present invention having leads at generally the same place as semiconductor package 82a can also be attached to semiconductor package 82a. Thereafter, a semiconductor package 40 (FIG. 1) or another semiconductor package constructed in accordance with the principles of the present invention can be stacked onto the entire stack. Semiconductor packages 82a and 82b are held in their stacked position by applying solder—or any other material commonly used in the art—between the semiconductor packages and/or between a semiconductor package and a printed circuit board.

Still referring to FIG. 14, a space 121 is created when semiconductor package 82a is physically attached to semiconductor package 82b. The heat generated by the semiconductor chips 52a, 52b in semiconductor packages 82a, 82b, respectively, can be dissipated through space 121. Though not shown, a plurality of solder balls can be sandwiched between upper portions 118b and the lower portions 120a.

Figure 15:
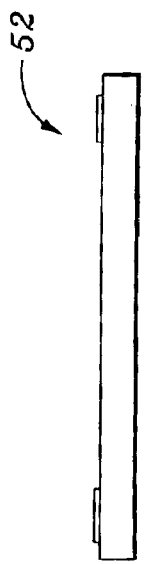
FIG. 15 is a side view of one embodiment of a semiconductor package constructed in accordance with the principles of the present invention.
Figure 16:
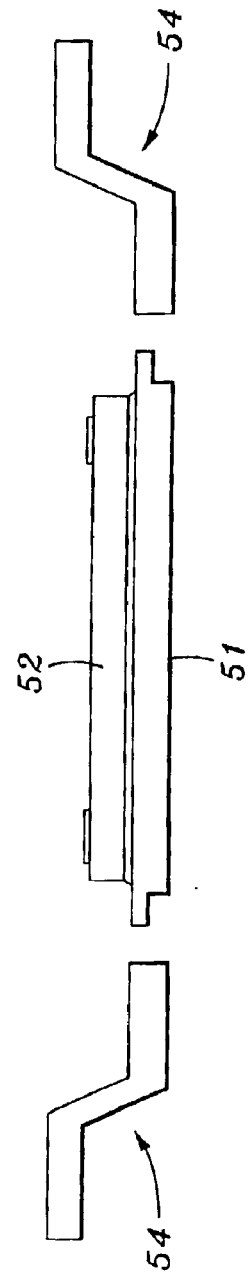
FIG. 16 is a side view of one embodiment of a semiconductor package constructed in accordance with the principles of the present invention.
Figure 17:
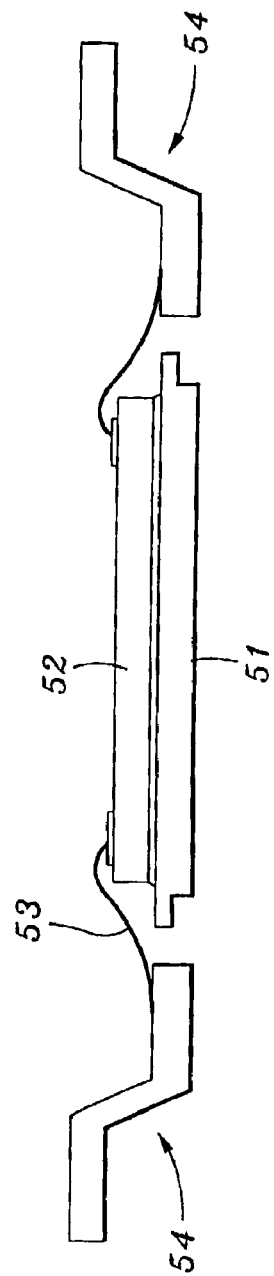
FIG. 17 is a side view of one embodiment of a semiconductor package constructed in accordance with the principles of the present invention.
Figure 18:
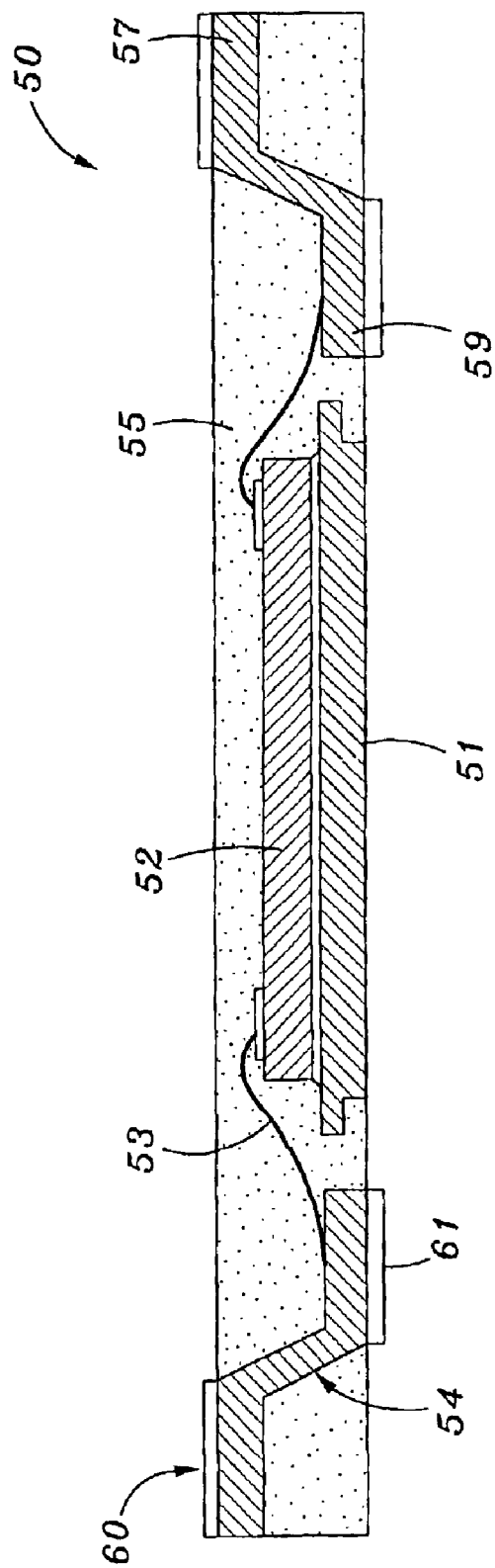
FIG. 18 is a side view of one embodiment of a semiconductor package constructed in accordance with the principles of the present invention.

Referring now to FIGS. 15 through 18, there is shown in side views a semiconductor in varying stages of manufacture according to a method for manufacturing the semiconductor packages constructed in accordance with the principles of the present invention. For illustrative purposes, the method for manufacturing semiconductor package 50 (FIG. 2) will be described below. Variations in the method for manufacturing other embodiments will be noted. To manufacture semiconductor package 50, a semiconductor chip 52 is first obtained (FIG. 15). Then, semiconductor chip 52 is attached to a paddle 51 via an adhesive (FIG. 16). It should be noted that other types of leadframes of other embodiments of the present invention may be used. Then, wires 53 are connected from semiconductor chip 52 to the plurality of leads 54 (FIG. 17). In FIG. 18, a sealing material 55 encapsulates the leadframe, semiconductor chip 52, and wires 53 of semiconductor package 50. Small sections 60, 61 are attached to the upper and lower portions 57, 59 of leads 54. Excess sealing material 55 is trimmed to the desired shape and length by hand or by using a trimming machine. Finally, the exposed portions of the leadframe (leads 54 and paddle 51) are coated or electroplated with a corrosion-minimizing material such as, for example, tin, gold, tin lead, nickel palladium, tin bismuth, or other similar materials.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

The following applications are all being filed on the same date as the present application and all are incorporated by reference as if wholly rewritten entirely herein, including any additional matter incorporated by reference therein:

| Attorney Docket No. | Title of Application | First Named Inventor |
| --- | --- | --- |
| 45475-00015 | Semiconductor Package Having Increased Solder Joint Strength | Kil Chin Lee |
| 45475-00016 | Clamp and Heat Block Assembly for Wire Bonding a Semiconductor Package Assembly | Young Suk Chung |
| 45475-00018 | Near Chip Size Semiconductor Package | Sean Timothy Crowley |
| 45475-00019 | Semiconductor Package | Sean Timothy Crowley |

-continued

| Attorney Docket No. | Title of Application | First Named Inventor |
|---|---|---|
| 45475-00021 | Stackable Semiconductor Package and Method for Manufacturing Same | Jun Young Yang |
| 45475-00024 | Method of and Apparatus for Manufacturing Semiconductor Packages | Hyung Ju Lee |
| 45475-00028 | Semiconductor Package Having Improved Adhesiveness and Ground Bonding | Sung Sik Jang |
| 45475-00029 | Semiconductor Package Leadframe Assembly and Method of Manufacture | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A method of fabricating a semiconductor package, comprising the steps of:
   a) providing a leadframe comprising:
      a die paddle defining opposed, generally planar top and bottom surfaces; and
      a plurality of leads extending at least partially about the die paddle in spaced relation thereto, each of the leads having an upper portion defining a generally planar top side and a first end, a lower portion defining a generally planar bottom side and a second end, and a middle portion extending between the upper and lower portions; the transition from the first end to the second end in each of the leads occurring without the lower portion reversing direction to extend along the upper portion;
   b) attaching a semiconductor chip to the top surface of the die paddle;
   c) electrically connecting the semiconductor chip to at least one of the leads; and
   d) at least partially encapsulating the leadframe and the semiconductor chip with a sealing material such that the bottom sides of the lower portions of the leads and the top sides of the upper portions of the leads are exposed in the sealing material.

2. The method of claim 1 wherein:
   step (c) comprises electrically connecting the semiconductor chip to the lower portion of at least one of the leads via a conductive wire; and
   step (d) comprises encapsulating the conductive wire with the sealing material.

3. The method of claim 2 wherein step (c) comprises connecting the conductive wire to a bond side of the lower portion which is disposed in opposed relation to the bottom side and extends in generally co-planar relation to the top surface of the die paddle.

4. The method of claim 1 wherein step (d) comprises partially encapsulating the leadframe such that the bottom surface of the die paddle is exposed in the sealing material.

5. The method of claim 4 wherein step (d) comprises filling the sealing material into a notched portion which extends about the bottom surface of the die paddle.

6. The method of claim 1 wherein step (d) comprises filling the sealing material into an etched portion formed within the upper and lower portions of each of the leads.

7. The method of claim 1 further comprising the steps of:
   e) attaching a top section to the top side of the upper section of each of the leads such that the top section protrudes outwardly from the sealing material; and
   f) attaching a bottom section to the bottom side of the lower section of each of the leads such that the bottom section protrudes outwardly from the sealing material.

8. The method of claim 7 wherein:
   step (e) comprises attaching a solder plate to the top side of the upper section of each of the leads; and
   step (f) comprises attaching a solder plate to the bottom side of the lower section of each of the leads.

9. A method of fabricating a semiconductor package, comprising the steps of:
   a) providing a leadframe comprising:
      a die paddle defining opposed, generally planar top and bottom surfaces;
      a first set of leads extending at least partially about the die paddle in spaced relation thereto; and
      a second set of leads extending at least partially about the leads of the first set in spaced relation thereto, each of the leads of the first and second sets having an upper portion defining a generally planar top side and a first end, a lower portion defining a generally planar bottom side and a second end, and a middle portion extending between the upper and lower portions, the transition from the first end to the second end in each of the leads of the first and second sets occuring without the lower portion reversing direction to extend along the upper portion;
   b) attaching a semiconductor chip to the top surface of the die paddle;
   c) electrically connecting the semiconductor chip to at least one of the leads of each of the first and second sets; and
   d) partially encapsulating the leadframe and the semiconductor chip with a sealing material such that the bottom sides of the lower portions of the leads of the first and second sets and the top sides of the upper portions of the leads of the first and second sets are exposed in the sealing material.

10. The method of claim 9 wherein:
    step (c) comprises electrically connecting the semiconductor chip to the lower portion of at least one of the leads of each of the first and second sets via conductive wires; and
    step (d) comprises encapsulating the conductive wires with the sealing material.

11. The method of claim 10 wherein step (c) comprises connecting each of the conductive wires to a bond side of the lower portion which is disposed in opposed relation to the bottom side and extends in generally co-planar relation to the top surface of the die paddle.

12. The method of claim 9 wherein step (d) comprises partially encapsulating the leadframe with the sealing material such that the bottom surface of the die paddle is exposed in the sealing material.

13. The method of claim 12 wherein step (d) comprises filling the sealing material into a notched portion which extends about the bottom surface of the die paddle.

14. The method of claim 9 wherein step (d) comprises filling the sealing material into an etched portion formed in the upper and lower portions of each of the leads of each of the first and second sets.

15. The method of claim 9 further comprising the steps of:

e) attaching a top section to the top side of the upper section of each of the leads of the first and second sets such that each of the top sections protrudes outwardly from the sealing material; and attaching a bottom section to the bottom side of the lower section of each of the leads of the first and second sets such that each of the bottom sections protrudes outwardly from the sealing material.

16. The method of claim 15 wherein:

step (e) comprises attaching a solder plate to the top side of the upper section of each of the leads of the first and second sets; and step (f) comprises attaching a solder plate to the bottom side of the lower section of each of the leads of the first and second sets.

17. A method of fabricating a chip stack, comprising the steps of:

a) providing first and second semiconductor packages, each of which comprises:
   a die paddle defining opposed, generally planar top and bottom surfaces;
   a plurality of leads extending at least partially about the die paddle in spaced relation thereto, each of the leads having an upper portion defining a generally planar top side and first end, a lower portion defining a generally planar bottom side, and a middle portion extending between the upper and lower portions, the transition from the first end to the second end in each of the leads occurring without the lower portion reversing direction to extend along the upper portion;
   a semiconductor chip attached to the top surface of the die paddle and electrically connected to at least one of the leads; and
   a sealing material at least partially encapsulating the leadframe and the semiconductor chip such that the bottom sides of the lower portions of the leads and the top sides of the upper portions of the leads are exposed in the sealing material; and b) electrically connecting the top sides of the upper portions of the leads of the first semiconductor package to respective ones of the top sides of the upper portions of the leads of the second semiconductor package.

18. The method of claim 17 further comprising the step of:

c) electrically connecting a third semiconductor package to the bottom sides of the lower portions of the leads of one of the first and second semiconductor packages.

19. A method of fabricating a chip stack, comprising the steps of:

a) providing first and second semiconductor packages, each of which comprises:
   a die paddle defining opposed, generally planar top and bottom surfaces;
   a first set of leads extending at least partially about the die paddle in spaced relation thereto;
   a second set of leads extending at least partially about the leads of the first set in spaced relation thereto, each of the leads of the first and second sets having an upper portion defining a generally planar top side and a first end, a lower portion defining a generally planar bottom side and a second end, and a middle portion extending between the upper and lower portions the transition from the first end to the second end in each of the leads of the first and second sets occurring without the lower portion reversing direction to extend along the upper portion;
   a semiconductor chip attached to the top surface of the die paddle and electrically connected to at least one of the leads of each of the first and second sets; and
   a sealing material at least partially encapsulating the leadframe and the semiconductor chip such that the bottom sides of the lower portions of the leads of the first and second sets and the top sides of the upper portions of the leads of the first and second sets are exposed in the sealing material;

b) electrically connecting the bottom sides of the lower portions of the leads of the first set of the first semiconductor package to respective ones of the bottom sides of the lower portions of the leads of the first set of the second semiconductor package; and c) electrically connecting the bottom sides of the lower portions of the leads of the second set of the first semiconductor package to respective ones of the bottom sides of the lower portions of the leads of the second set of the second semiconductor package.

* * * * *